United States Patent
Gross et al.

(10) Patent No.: US 12,350,710 B2
(45) Date of Patent: Jul. 8, 2025

(54) CAPACITIVE MICROMACHINED ULTRASONIC TRANSDUCER AND METHOD OF MANUFACTURING THE SAME

(71) Applicant: Vermon S.A., Tours (FR)

(72) Inventors: Dominique Gross, Tours (FR); Cyril Meynier, Tours (FR); Nicolas Sénégond, Tours (FR)

(73) Assignee: VERMON S.A., Tours (FR)

( * ) Notice: Subject to any disclaimer, the term of this patent is extended or adjusted under 35 U.S.C. 154(b) by 1551 days.

(21) Appl. No.: 16/684,784

(22) Filed: Nov. 15, 2019

(65) Prior Publication Data
US 2020/0156111 A1 May 21, 2020

Related U.S. Application Data

(60) Provisional application No. 62/768,188, filed on Nov. 16, 2018.

(51) Int. Cl.
*B06B 1/02* (2006.01)
*B81B 3/00* (2006.01)
*B81C 1/00* (2006.01)

(52) U.S. Cl.
CPC .......... *B06B 1/0292* (2013.01); *B81B 3/0086* (2013.01); *B81C 1/00698* (2013.01);
(Continued)

(58) Field of Classification Search
None
See application file for complete search history.

(56) References Cited

U.S. PATENT DOCUMENTS

| 6,274,913 B1 | 8/2001 | Brigham et al. |
| 6,380,010 B2 | 4/2002 | Brigham et al. |

(Continued)

FOREIGN PATENT DOCUMENTS

| CN | 101558552 A | 10/2009 |
| JP | 2009-508367 A | 2/2009 |

(Continued)

OTHER PUBLICATIONS

Michael L. Reed, Gary K. Fedder; 2—Photolithographic Microfabrication; Editor(s): T. Fukuda, W. Menz; Handbook of Sensors and Actuators; Elsevier Science B.V.; vol. 6;1998; pp. 13-61. (Year: 1998).*

(Continued)

*Primary Examiner* — Christine S. Kim
*Assistant Examiner* — Tyler J Wiegand
(74) *Attorney, Agent, or Firm* — Stites & Harbison, PLLC; Jeffrey A. Haeberlin; James R. Hayne

(57) ABSTRACT

A capacitive micromachined ultrasonic transducer including a lower electrode, an upper electrode, and a membrane attached to the upper electrode and positioned between the lower electrode and the upper electrode. Anchors are connect to the membrane and the lower electrode such that a cavity is defined between the lower electrode and the membrane. One or more posts are positioned within the cavity, the posts partially buried within the membrane and extending towards the lower electrode. A method of producing a capacitive micromachined ultrasonic transducer includes forming an oxide growth layer on a device layer of undoped silicon and removing portions of the oxide growth layer to form anchors extending beyond the outer surface of the device layer and posts partially buried within post holes in the device layer and extending beyond the outer surface of the device layer.

14 Claims, 12 Drawing Sheets

(52) U.S. Cl.
CPC ............... *B81B 2201/0271* (2013.01); *B81B 2203/0127* (2013.01); *B81B 2203/0307* (2013.01); *B81B 2203/0315* (2013.01); *B81B 2203/04* (2013.01); *B81C 2201/0125* (2013.01); *B81C 2201/0132* (2013.01); *B81C 2201/0178* (2013.01); *B81C 2203/036* (2013.01)

(56) References Cited

U.S. PATENT DOCUMENTS

| | | | |
|---|---|---|---|
| 6,430,109 | B1 | 8/2002 | Khuri-Yakub et al. |
| 6,443,901 | B1 | 9/2002 | Fraser |
| 6,472,290 | B2 | 10/2002 | Cho et al. |
| 7,087,023 | B2 | 8/2006 | Daft et al. |
| 7,102,472 | B1 | 9/2006 | Nathanson et al. |
| 7,530,952 | B2 | 5/2009 | Huang et al. |
| 7,612,483 | B2 | 11/2009 | Degertekin |
| 7,759,839 | B2 | 7/2010 | Huang |
| 7,780,597 | B2 | 8/2010 | Panda et al. |
| 7,923,795 | B2 | 4/2011 | Kobayashi |
| 8,008,105 | B2 | 8/2011 | Huang |
| 8,120,229 | B2 | 2/2012 | Huang |
| 8,198,782 | B2 | 6/2012 | Machida et al. |
| 8,247,945 | B2 | 8/2012 | Huang |
| 8,315,125 | B2 | 11/2012 | Lemmerhirt |
| 8,402,831 | B2 | 3/2013 | Kupnik et al. |
| 8,483,014 | B2 | 7/2013 | Huang |
| 8,526,271 | B2 | 9/2013 | Huang |
| 8,559,274 | B2 | 10/2013 | Huang |
| 8,716,816 | B2 | 5/2014 | Fitzpatrick |
| 8,740,800 | B2 | 6/2014 | Wakabayashi et al. |
| 8,796,901 | B2 * | 8/2014 | Huang .................. H02N 1/006 367/181 |
| 8,952,595 | B2 | 2/2015 | Huang |
| 9,067,779 | B1 | 6/2015 | Rothberg et al. |
| 9,499,395 | B2 | 11/2016 | Rothberg et al. |
| 9,539,854 | B2 | 1/2017 | Klootwijk et al. |
| 9,821,340 | B2 | 11/2017 | Zhuang et al. |
| 2004/0085858 | A1 * | 5/2004 | Khuri-Yakub ......... G01H 11/08 367/181 |
| 2005/0177045 | A1 | 8/2005 | Degertekin et al. |
| 2006/0004289 | A1 | 1/2006 | Tian et al. |
| 2008/0283945 | A1 | 11/2008 | Kobayashi et al. |
| 2008/0290756 | A1 * | 11/2008 | Huang .................. B06B 1/0292 310/300 |
| 2009/0122651 | A1 | 5/2009 | Kupnik et al. |
| 2011/0095645 | A1 | 4/2011 | Chang |
| 2012/0069701 | A1 | 3/2012 | Machida et al. |
| 2013/0147313 | A1 | 6/2013 | Sachse |
| 2014/0061826 | A1 * | 3/2014 | Hong .................. B81C 1/00158 257/416 |
| 2014/0211366 | A1 | 7/2014 | Morris, III et al. |
| 2014/0295606 | A1 | 10/2014 | Larrey et al. |
| 2015/0180370 | A1 | 6/2015 | Huang |
| 2015/0229236 | A1 | 8/2015 | Tian et al. |
| 2017/0010301 | A1 | 1/2017 | Bieselt et al. |
| 2017/0325030 | A1 | 11/2017 | Stoppel et al. |
| 2018/0369862 | A1 * | 12/2018 | Alie .................. B81C 1/00246 |

FOREIGN PATENT DOCUMENTS

| | | |
|---|---|---|
| JP | 2009-100460 A | 5/2009 |
| WO | 2006/134580 A2 | 12/2006 |
| WO | 2009/016606 A2 | 2/2009 |
| WO | 2009/041675 A1 | 4/2009 |
| WO | 2010/032156 A2 | 3/2010 |
| WO | 2010/137528 A1 | 12/2010 |
| WO | 2013/005486 A1 | 1/2013 |
| WO | 2013/111040 A1 | 8/2013 |
| WO | 2016/040333 A2 | 3/2016 |
| WO | 2016/080931 A1 | 5/2016 |
| WO | 2017/076843 A1 | 5/2017 |

OTHER PUBLICATIONS

Savoia, A.S., et al. "Optimization of the Efficiency and Reliability of Reverse-Fabricated CMUT Arrays," 2017 IEEE International Ultrasonics Symposium.
Mahmud, M.M., et al. "Improved CMUT structure and method of operation for dual-frequency acoustic angiography," 2017 International Ultrasonics Symposium, No. 1160483, pp. 2-5.
Greenlay, B., et al. "CMUT Isolated Isolation Posts," 2017 IEEE International Ultrasonics Symposium.
Machida, S., et al. "Highly Reliable CMUT Cell Structure with Reduced Dielectric Charging Effect," 2015 IEEE International Ultrasonics Symposium Proceedings.
Huang, Y., et al. "Capacitive micromachined ultrasonic transducers (CMUTs) with isolation posts," ScienceDirect, Ultrasonics, vol. 48, No. 1, (2008), pp. 74-81.
Huang, Y., et al. "A Solution to the Charging Problems in Capacitive Micromachined Ultrasonic Transducers," 2005 IEEE Transactions on Ultrasonics, Ferroelectrics, and Frequency Control, vol. 52, No. 4, 578-580.
Doody, C.B., et al. "Characterization and Modeling of Capacitive Micromachined Ultrasonic Transducers for Diagnostic Ultrasound," 2008 ASME International Mechanical Engineering Congress and Exposition, Oct. 31-Nov. 6, 2008, Boston, Massachusetts, pp. 1-8.
Khuri, HHS Public Access, Author Manuscript, J. Micromech Microeng, May 2011, 21(5): 054004-054014.
Park, K.K., et al. "Fabrication of Capacitive Micromachined Ultrasonic Transducers via Local Oxidation and Direct Wafer Bonding," Journal of Microelectromechanical Systems, vol. 20, No. 1, Feb. 2011, pp. 95-103.
The State Intellectual Property Office of China, Office Action (Notification of the First Office Action) Issued in corresponding Application No. 201980075767.1 issued Feb. 7, 2022.
European Patent Office, Office Action issued in corresponding Application No. 19809177.9, dated Apr. 14, 2023.
Japan Patent Office, Office Action (Notice of Reasons for Refusal) issued in corresponding Application No. JP 2021-526659, mailed Jan. 9, 2024. (Partial translation attached.).
European Patent Office, International Search Report and Written Opinion issued in counterpart PCT Application No. PCT/IB2019/059848, mailed Feb. 21, 2020.
Japan Patent Office, Office Action (Decision of Refusal) issued in corresponding Application No. JP 2021-526659 mailed Oct. 29, 2024.
European Patent Office, Examination Report issued in corresponding Application No. EP 19809177.9 dated Apr. 16, 2025.

* cited by examiner

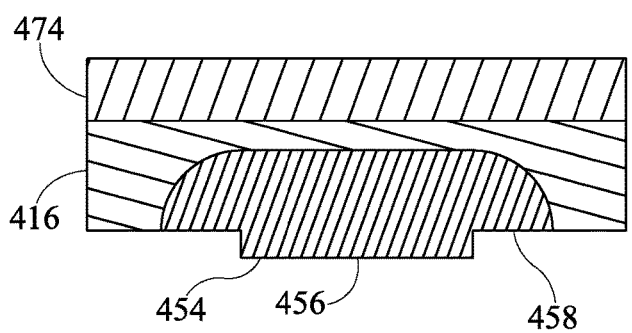 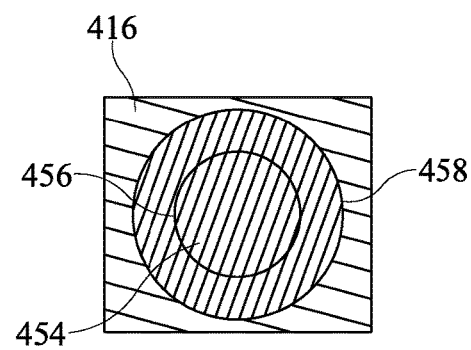
FIG. 33A                FIG. 33B
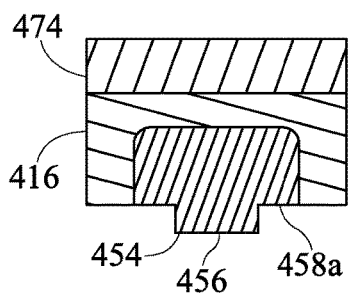 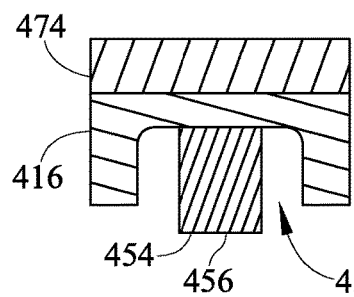 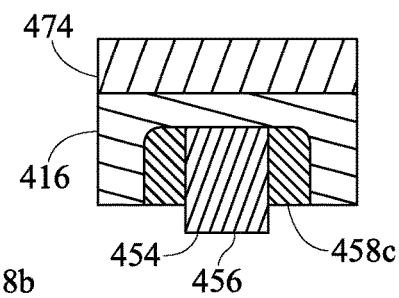
FIG. 34A          FIG. 34B          FIG. 34C

I

II

III

IV

V

CAPACITIVE MICROMACHINED ULTRASONIC TRANSDUCER AND METHOD OF MANUFACTURING THE SAME

RELATED APPLICATIONS

This application claims the benefit of U.S. Provisional Application No. 62/768,188, filed Nov. 16, 2018, the entire disclosure of which is incorporated herein by this reference.

TECHNICAL FIELD

The present invention is related to an original wafer-bonding process, optimized regarding to charge trapping phenomenon, and especially suitable for fabrication on a heavily-doped substrate.

BACKGROUND OF THE INVENTION

Capacitive Micromachined Ultrasonic Transducers (CMUT) represent a promising alternative to the classical piezoelectric transducers for ultrasonic medical imaging. Being exclusively studied by the academic world since the beginning of the technology in 1994, the technology is close to readiness for the ultrasonic market. Nevertheless, the reliability of the technology is still a subject of concern for the manufacturers, as a CMUT-based medical probe requires a minimum lifespan of 7 years of daily use. The main source of failure is well-known in the field of capacitive microelectromechanical systems, and is due to charge injection inside the dielectric layers, which can eventually lead to dielectric breakdown, performance decreases, and device failure. Basically, a CMUT transducer is made of two electrodes, one fixed on a substrate whereas the other is mobile, hanged above a vacuum cavity. To avoid any risk of short-circuit during the operation, these two electrodes are insulated by a thin layer of dielectric material, known as insulation layer. Because of the small space between the two electrodes and the high electric field required for operation, charge carriers migrate from one electrode to the other, and generally remain trapped inside the insulation layer. This leads to a dramatic shift of operation, a strong decrease of the performances, and often to permanent damages to the device. Because the charging phenomenon is very complex and leads to strong dysfunctions, a lot of groups developing CMUT transducers—and more generally MEMs—have worked hard to avoid—or at least decrease—the impact of this spurious effect.

Many solutions addressing charge trapping have been proposed, published, and patented over the years by several academic and industrial groups. One of the most common solutions found in the literature is based on the patterning of the insulation layer in such a way that it is replaced by isolation posts. With such a design, the charge trapping is reduced as the contact surface between the two electrodes is limited by the surface of the posts [1]-[7].

For example, FIG. 1A illustrates a classical CMUT 10 design with a plain insulation layer 12 and FIG. 1B illustrates a modified CMUT 20 design with embedded isolation posts 22. The CMUT 20 in FIG. 1B has the great advantage to be very easy to set up. However, it involves a decrease of the device's capacitance as the permittivity of vacuum is at least 4 time weaker than the one of the insulation layer (considering an insulation layer made of silicon dioxide). Moreover, this design reduces the quantity of charges injected in-between the electrodes, but not the charging mechanism by itself: charges still migrate inside the posts (even more easily as the electric field has to be slightly increased to compensate for the loss of electrostatic forces). For these reasons, this solution is sometimes coupled with a patterning of either the top or the bottom electrode, in such a way that there is no electrode above or below the isolation posts. This reduces the electric stress inside the posts, and therefore the charge migration. This solution has been patented by Hitachi [4] on their sacrificial layer release process, as shown in the CMUT 30, 40 shown in FIGS. 2A and 2B with isolation posts 32, 42 hanging below the membrane instead of lying at the bottom of the cavity.

This solution is particularly secure as the electric stress is greatly reduced inside the posts. However, it requires to pattern at least one electrode, which is not always easy, and impossible for fusion bonding-based processes. The same kind of approach has also been proposed by the groups from North Carolina State University [7] and the University of Alberta [6]. In fact, separating the mechanical function from the electrostatic function is a good way to go, but it is also very difficult to set up regarding to the essential structure of a CMUT cell. For example, and as illustrated in the schematic diagram of FIG. 3, International Patent Publication WO 2006/123301 to Kolo Technologies, Inc. describes a specific CMUT 50 design following this idea.

According to this design, the membrane 52 used for ultrasonic emission is very rigid, and placed upon smaller membranes 54 used as springs to allow a piston-like displacement. The insulation layer between the electrodes can be completely removed if the mechanical gap $h_m$ is smaller than the electrical gap $h_e$. Therefore, the charge trapping issue is suppressed. The complexity of this design is the main issue, as it should lead to higher costs and smaller manufacturing yield. Furthermore, it requires a strong understanding of the mechanical behavior of such an unusual structure.

The properties of the dielectric material are key parameters of the charge trapping problem. Generally, the insulation layer is made of silicon nitride ($Si_xN_y$) or silicon dioxide ($SiO_2$), depending on the manufacturing process. The mitigation of charge trapping is improved by using high quality dielectrics, with low defects density, and high band gap. This highly depends on the manufacturing recipe, even if silicon dioxide is theoretically better than silicon nitride on this aspect. More generally, the band diagram of the whole stack is an important parameter to take into account to decrease charge trapping. Philips Innovation patented a CMUT device with a specific multilayer stack oxide-nitride-oxide specially developed to decrease the charging effects [8]. The research group from Roma III University replaced a part of the nitride layer by silicon dioxide to take benefit of its high band gap [9]. The quality of the insulation layer can be strongly degraded by partial plasma etching. Furthermore, in the case where the insulation material is native silicon dioxide, the growth from heavily-doped substrates creates defects inside the crystalline structure because of the dopant. However, heavily-doped substrates are often convenient to use, especially for devices needing 3D packaging, where Through-Silicon Vias are employed.

In addition to these two propositions, several other ways have been proposed to reduce charge trapping: decreasing the height of the cavity to decrease the electric field and therefore the charge migration, removing completely the insulation layer, etc. It is believed that these possibilities are almost impossible to set up in an industrial context, or decrease the performances of the device. Keeping the acoustic performances while reducing charge trapping represents the main difficulty of the work. For instance, decreasing the height of the cavity shall induce a significant lowering of the sensitivity. It is believed that the different solutions proposed in the literature generally involve a loss of performance. This is obviously a strong drawback, not acceptable in many cases where the CMUT transducers encounter a strong competition from the piezoelectric technology.

BRIEF SUMMARY OF THE INVENTION

The present invention is related to an original wafer-bonding process, optimized regarding to charge trapping phenomenon, and especially suitable for fabrication on a heavily-doped substrate. This new process preserves—or even improves—the acoustic performances compared to the classical design, and embeds several interesting features: (1) a declination of the isolation posts in such a way that the posts are partially buried inside the structure of the transducer; (2) a dedicated manufacturing strategy to grow an optimal oxide layer on a heavily-doped substrate by patterning only the SOI wafer to create the device; and (3) a diminution of the parasitic capacitance.

According to some exemplary embodiments of the present invention, a capacitive micromachined ultrasonic transducer includes a lower electrode, an upper electrode, and a membrane attached to the upper electrode and positioned between the lower electrode and the upper electrode. Anchors are connected to the membrane and the lower electrode such that a cavity is defined between the lower electrode and the membrane. One or more posts are positioned within the cavity, and the posts are partially buried within the membrane so as to extend toward the lower electrode.

In some exemplary embodiments, the anchors are also partially buried within the membrane. In some particular embodiments, each of the anchors includes a central member partially buried within the membrane and extending to the lower electrode and a guard ring substantially buried within the membrane and surrounding the central member. In some particular embodiments, the central member and the guard ring are formed of the same material. In some other embodiments, the central member is formed of a first material and the guard ring is formed of a second material. In still other embodiments, an empty guard ring is defined in the membrane surrounding the central member.

In some exemplary embodiments, each of the posts includes a central member partially buried within the membrane and extending towards the lower electrode and a guard ring substantially buried within the membrane and surrounding the central member. In some particular embodiments, the central member and the guard ring are formed of the same material. In some other embodiments, the central member is formed of a first material and the guard ring is formed of a second material. In still other embodiments, an empty guard ring is defined in the membrane surrounding the central member.

In some embodiments of the present invention, the lower electrode is a wafer of heavily doped silicon.

In some embodiments of the present invention, the membrane defines post holes extending partially into the membrane with one of the one or more posts positioned within each of the post holes so as to extend out of the post hole. In some particular embodiments, a gap is defined between a lateral wall of each of the one or more posts and a lateral inner wall of the respective post hole.

According to one exemplary implementation of the present invention, a method of producing a capacitive micromachined ultrasonic transducer begins by providing a device layer of undoped silicon with an outer surface that is exposed. The outer surface of the device layer is then etched to form post holes extending partially into the device layer. An oxide growth layer is formed on the device layer so as to fill the post holes and cover the outer surface of the device layer, and portions of the oxide growth layer are removed to form anchors extending beyond the outer surface of the device layer and posts partially buried within the post holes and extending beyond the outer surface of the device layer. The anchors are then bonded to a first electrode forming a cavity defined by the first electrode, the device layer, and the anchors. The posts are positioned within this cavity. An upper electrode is also deposited on a surface of the device layer opposite from the outer surface of the device layer.

According to some exemplary implementations, the outer surface of the device layer is etched to form anchor holes extending partially through the device layer and the anchors are partially buried within the anchor holes.

According to some particular implementations, the step of forming the oxide growth layer on the device layer is performed by high temperature thermal oxidation of the device layer. For example, the high temperature thermal oxidation is done at a temperature of about 800° C. to about 1200° C. and more preferably about 1100° C.

According to some exemplary implementations, the oxide growth layer is formed to a thickness greater than or equal to a depth of the post holes. According to some other particular implementations, the oxide growth layer is formed to a thickness greater than or equal to a height of the anchors.

According to some exemplary implementations, the method further comprises a step of planarizing the oxide growth layer. In some particular implementations, the oxide growth layer is planarized until even with the outer surface of the device layer. In some other particular implementations, the oxide growth layer is planarized until the oxide growth layer has a thickness equal to a height of the anchors.

According to some exemplary implementations, plasma etching is used to removing portions of the oxide growth layer to form the anchors and posts.

According to some exemplary implementations, the method further comprises a step of chemically etching the oxide growth layer out of the post holes.

According to some exemplary implementations, the method further comprises a step of forming a second oxide growth layer on the device layer so as to fill the post holes and cover the outer surface of the device layer. Portions of the second oxide growth layer are then removed to form the anchors and the posts.

According to some exemplary implementations, the method further comprises a step of planarizing the anchors.

According to some exemplary implementations, the method further comprises a step of plasma etching the posts to reduce a height of the posts to be less than a height of the anchors.

DESCRIPTION OF THE DRAWINGS

Embodiment herein will hereinafter be described in conjunction with the appended drawings and illustrations provided to illustrate and not limit the scope of the claims:

FIG. 33A is a schematic diagram of a partially buried isolation post of the present invention.

FIG. 33B is a plan view of the isolation post of FIG. 33A.

FIG. 34A is a schematic diagram of an isolation post having a guard ring made of the same material as a central member.

FIG. 34B is a schematic diagram of an isolation post having an empty guard ring around a central member.

FIG. 34C is a schematic diagram of an isolation post having a guard ring made of a material different than the material of a central member.

DESCRIPTION OF EXEMPLARY EMBODIMENTS OF THE INVENTION

The present invention is related to an original wafer-bonding process, optimized regarding to charge trapping phenomenon, and especially suitable for fabrication on a heavily-doped substrate. This new process preserves—or even improves—the acoustic performances compared to the classical design, and embeds several interesting features: (1) a declination of the isolation posts in such a way that the posts are partially buried inside the structure of the transducer; (2) a dedicated manufacturing strategy to grow an optimal oxide layer on a heavily-doped substrate by patterning only the SOI wafer to create the device; and (3) a diminution of the parasitic capacitance.

The present invention contemplates three different CMUT designs and related methods of manufacturing based on wafer bonding and which have the specificity to manufacture the major steps on the SOI wafers.

Figure 15:
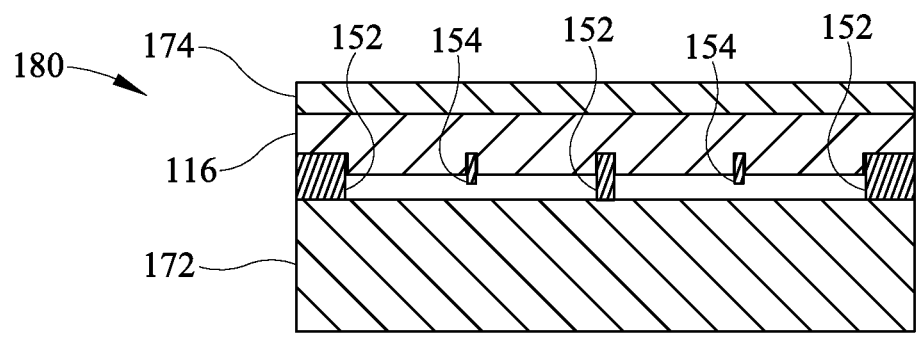
FIG. 15 is a schematic diagram of a complete CMUT transducer made in accordance with the first implementation of the present invention.
Figure 25:
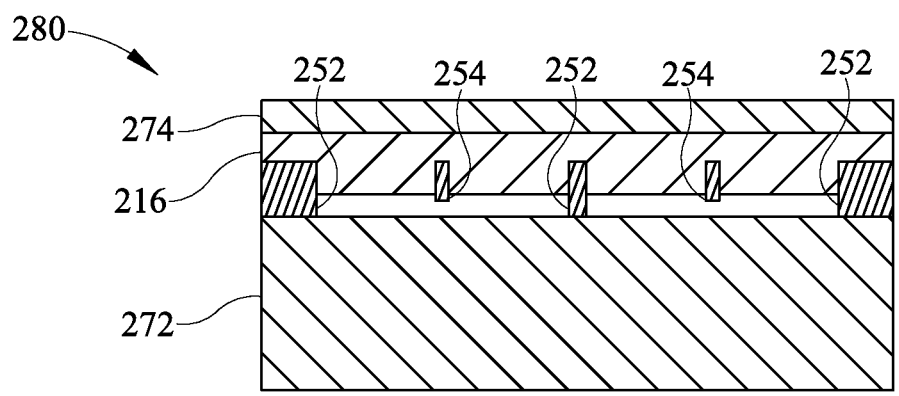
FIG. 25 is a schematic diagram of a complete CMUT transducer made in accordance with the second implementation of the present invention.
Figure 32:
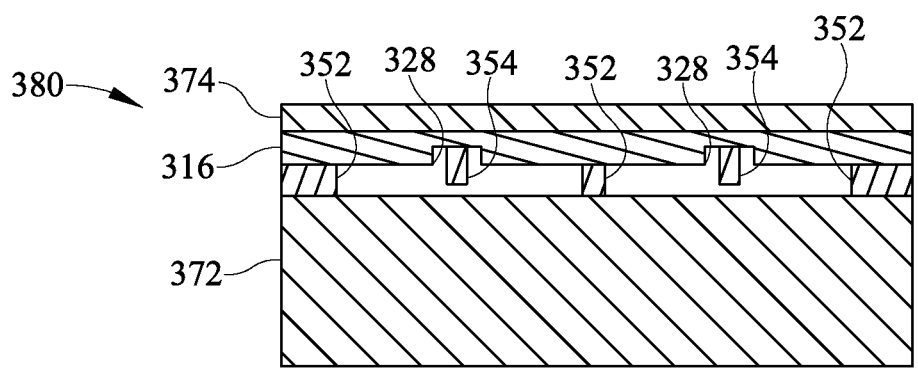
FIG. 32 is a schematic diagram of a complete CMUT transducer made in accordance with the third implementation of the present invention.

Referring first to FIG. 15, one exemplary CMUT 180 made in accordance with the present invention includes a lower electrode 172, an upper electrode 174 and a membrane 116 attached to the upper electrode 174 and positioned between the lower electrode 172 and the upper electrode 174. Anchors 152 are connected to the membrane 116 and the lower electrode 172 such that a cavity is defined between the lower electrode 172 and the membrane 116, and one or more posts 154 are positioned within the cavity. As discussed further below, the anchors 152 and isolation posts 154 are formed on and partially buried within the membrane 116. In another embodiment, and referring now to FIG. 25, a CMUT 280 made in accordance with the present invention likewise includes a lower electrode 272, an upper electrode 274, and a membrane 216 with anchors 252 and isolation posts 254 formed on and partially buried within the membrane 216. In yet another embodiment, and referring now to FIG. 32, a CMUT 380 made in accordance with the present invention includes a lower electrode 372, an upper electrode 374, and a membrane 316 with anchors 352 and isolation posts 354 formed on and partially buried within the membrane 316. As shown in FIGS. 15, 25, and 32, in each embodiment, the posts 154, 254, 354 are partially buried within the respective membrane 116, 216, 316. In the first and second embodiments, the anchors 152, 252 are likewise partially buried within the respective membrane 116, 216.

However, in the third embodiment, the anchors 352 are not buried within the membrane 316.

Each of the designs conserve the main goal of the invention, to reduce charge trapping phenomena and at the same time conserve sufficient electromechanical performances (for instance, a high useful capacitance, a low parasitic capacitance, etc.).

The three designs and related methods share three features that will collectively reduce charging effects when compared to reference process: (1) The "insulation posts" principle: rather than filling the entire surface of the membrane, the insulator is only present in one or several posts. Thus, even with the same intensity of charging (in terms of charges par volume units), the effect of the charges (as measured by a shift in the bias of the CMUT) would be much less; (2) The insulation posts are made thicker by burying them partly in the membrane. This reduces the vertical electric field within them; and (3) The insulation is grown on the SOI side, thus on undoped silicon, which avoids the presence of dopants (thus traps) in the oxide. Additional advantages for one or more of the embodiments, as well as method of producing the same, are also described below.

First Embodiment

In addition to the features common to all three designs and related methods, the first embodiment of the design illustrated in FIG. 15 has the following advantages: (1) The isolation posts are partially buried inside the CMUT structure. This allows the use of tall posts, which involves a lower electric stress while keeping the capacitance of the device; (2) The method of producing the CMUT of the first embodiment requires no partial etching of the insulation layer, which avoids deterioration due to etching plasma; (3) The anchors are partially buried inside the CMUT membranes, which involves a lower parasitic capacitance and therefore increased performances; and (4) The anchors can be made in such a way that the membranes produce a piston-like displacement and therefore increased sensitivity.

Figure 4:
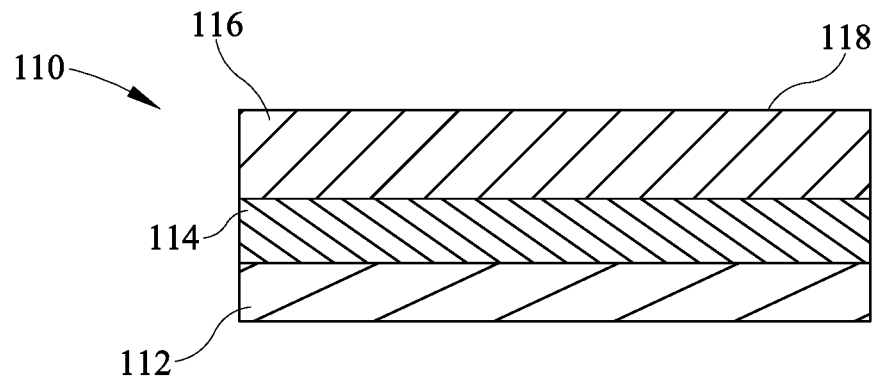
FIG. 4 is a schematic diagram of a SOI wafer used in accordance with a first implementation of the present invention.

According to a first exemplary method of producing a first embodiment of the CMUT of the present invention, and referring now to FIG. 4, the process starts from a classical silicon on insulator (SOI) wafer 110 including, from bottom to top: handle 112; buried oxide (BOX) layer 114; and device layer 116 having an exposed outer surface 118. In some exemplary embodiments, the device layer 116 is an undoped silicon layer 116.

Figure 5:
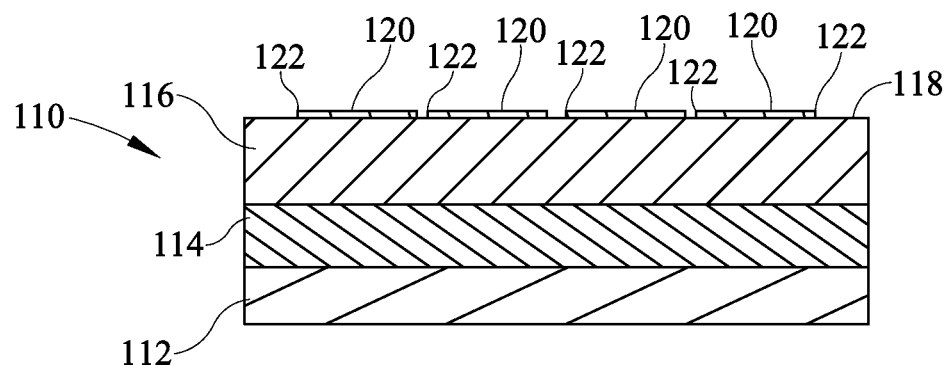
FIG. 5 is a schematic diagram of a first resist pattern formed on the SOI wafer of FIG. 4.

Referring now to FIG. 5, a first resist pattern 120 is deposited on the outer surface 118 of the device layer 116 with openings 122 defined through the resist 120 to expose the outer surface 118 of the device layer 116. As explained further below, the isolation posts 154 and the anchors 152 of the resulting CMUT 180 described above with respect to FIG. 15 are formed at the locations of the openings 122 in the first resist pattern 120. In particular, the lateral dimensions of the posts 154 and anchors 152 are determined at this point. The first resist pattern 120 corresponds to a first photolithography mask.

Figure 6:
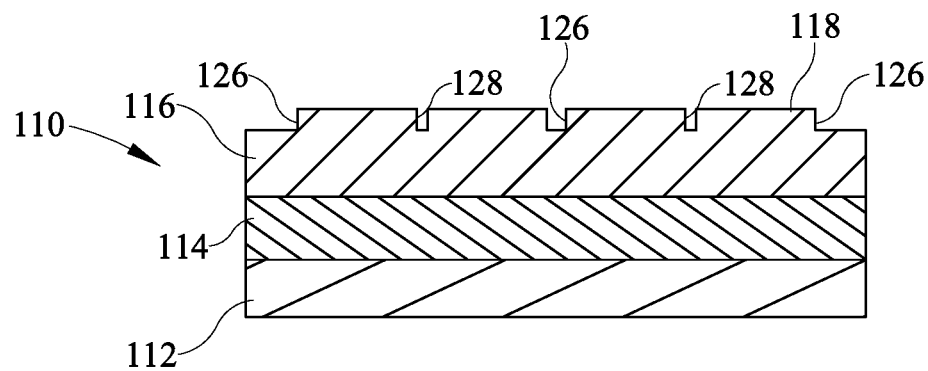
FIG. 6 is a schematic diagram of the SOI wafer of FIG. 5 after (D)RIE is performed and the first resist is removed.

Referring now to FIG. 6, a first (deep) reactive ion etching, i.e., (D)RIE, is made into the outer surface 118 of the device layer 116 forming anchor holes 126 and post holes 128 that extend partially into the device layer 116 at locations corresponding to the openings 122 in the resist 120 shown in FIG. 4. Once the holes 126, 128 are formed, the resist 120 is lifted off leaving the device layer 116 with holes 126, 128 shown in FIG. 6.

According to some exemplary implementations, the width of the isolation posts 154 and the anchors 152 to be formed corresponds to the width of the respective holes 126, 128 defined in the device layer 116. Likewise, the depth of the holes 126, 128 determines the heights of the isolation posts 154 and the anchors 152.

In some embodiments, the anchor holes 126 and the post holes 128 are formed with different dimensions. For example, in some preferred embodiments, the difference in the depth of the holes 126, 128 defines the height difference between the anchors 152 and the posts 154 (typically in the 10 nm to 500 nm range). A deeper etching of these holes 126, 128 into the device layer 116 increases the isolation of the resulting posts 154 and anchors 152 but also reduces the mechanical strength of the resulting membrane 116. Therefore depth of the holes 126, 128 is typically kept to less than about 80% of the thickness of the device layer 116. In some embodiments, the lateral dimensions of the holes 126, 128 are calculated by adding the lateral dimension of the non-buried part of the eventual restive anchors or posts to n times the hole depth, where n is a factor typically around 2.0.

Figure 7:
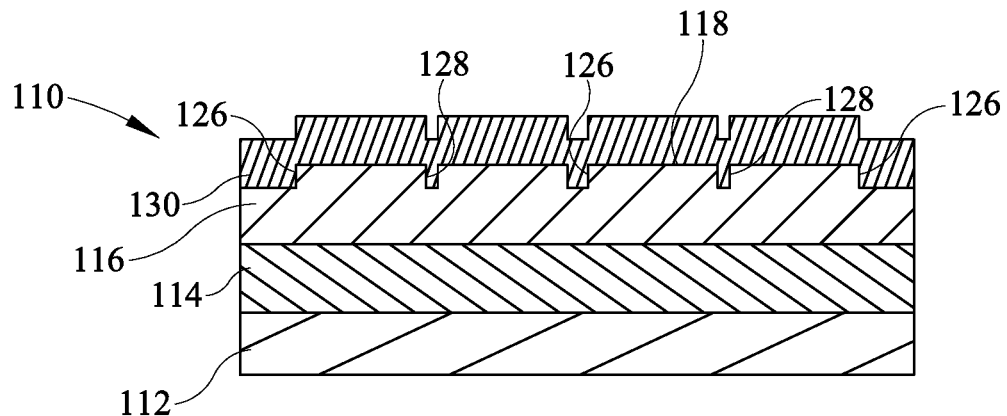
FIG. 7 is a schematic diagram of a first oxide growth formed on the SOI wafer of FIG. 6.

Referring now to FIG. 7, a first oxide growth layer 130 is formed on the device layer 116 so as to fill each of the holes 126, 128 as well as cover the outer surface 118 of the device layer 116. In particular, in some preferred embodiments, a first high temperature thermal oxidation is performed under dry atmosphere forming the first oxide growth layer 130 on the device layer 116. In some embodiments, the first high temperature thermal oxidation is performed at a temperature in the range of about 800° C. to about 1200° C., and more preferably about 1100° C. It is contemplated that this process will produce high oxide quality. In some particular embodiments, for example where the device layer 116 is comprised of undoped silicon, the first oxide growth layer 130 is comprised of silicon dioxide, but other oxides are possible without departing from the spirit and scope of the present invention. The thickness of the first oxide growth layer 130 should preferably be equal or higher than the depth of the holes 126, 128 defined in the device layer 116.

Figure 8:
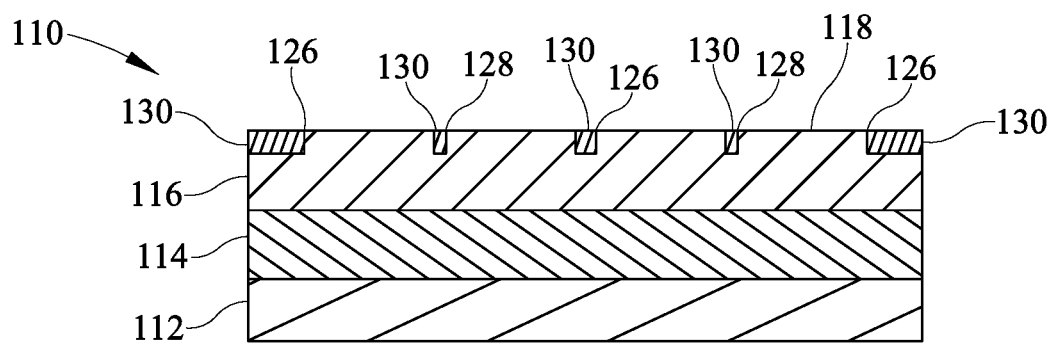
FIG. 8 is a schematic diagram of the SOI wafer of FIG. 7 after a first CMP is performed.

Referring now to FIG. 8, a chemical-mechanical planarization (CMP) is performed to remove the first oxide growth layer 130 until the remaining oxide growth layer 130 is even with the outer surface 118 of the device layer 116. In other words, after this planarizing step, the first oxide growth layer 130 is only contained within the holes 126, 128 defined in the device layer 116.

Figure 9:
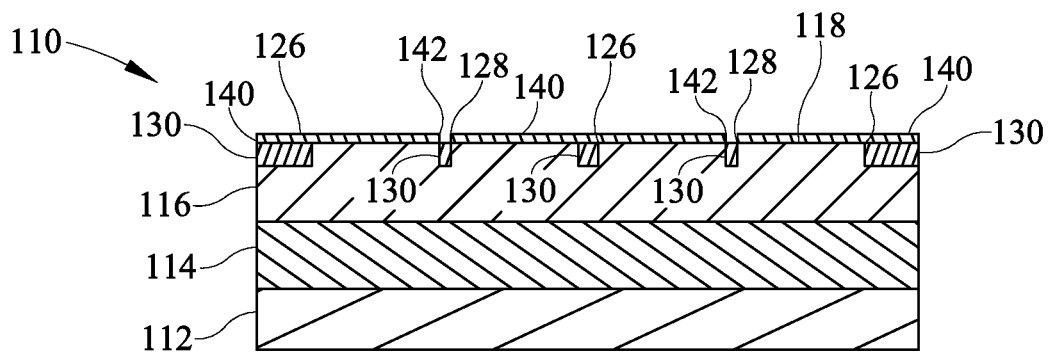
FIG. 9 is a schematic diagram of a second resist pattern formed on the SOI wafer of FIG. 8.

Referring now to FIG. 9, a second resist pattern 140 is deposited on the now planar surface formed from the outer surface 118 of the device layer 116 and the remainder of the first oxide growth layer 130 contained within the holes 126, 128 defined in the device layer 116. The second resist pattern 140 defines openings 142 through the resist 140. In this exemplary embodiment, the openings 142 are only above where the posts 154 will be formed (i.e., above the post holes 128) so as to exposed the first oxide growth layer 130 below. The second resist pattern 140 represents a second photolithography mask.

Figure 10:
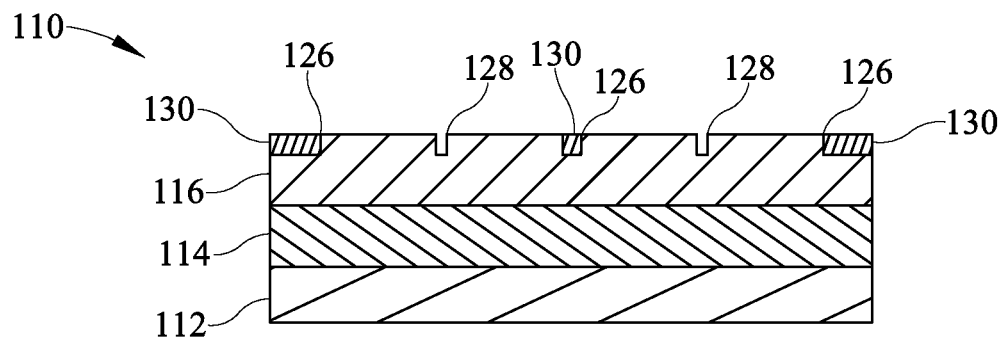
FIG. 10 is a schematic diagram of the SOI wafer of FIG. 9 after (D)RIE is performed and the second resist is removed.

Referring now to FIG. 10, a complete etching of the oxide filling the post holes 128 is performed. In some preferred embodiments, this is performed through a chemical etching (e.g., HF etching) but other etching means are possible without departing from the spirit and scope of the present invention. Once the etching is completed, the resist 140 is lifted off leaving the device layer 116 with empty post holes 128 but anchor holes 126 still filled with the first oxide growth layer 130 shown in FIG. 9.

Figure 11:
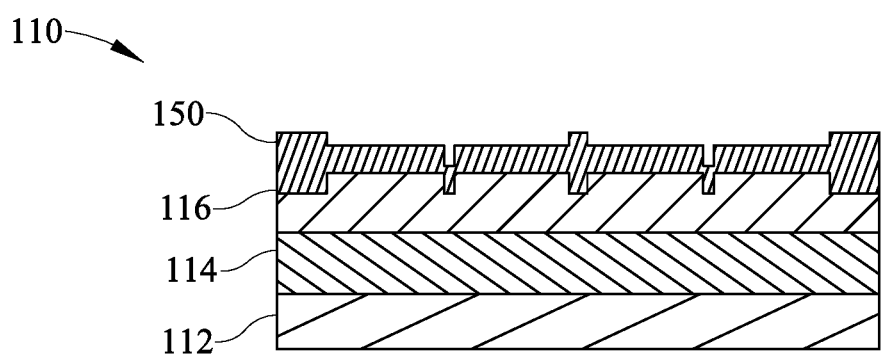
FIG. 11 is a schematic diagram of a second oxide growth formed on the SOI wafer of FIG. 10.

Referring now to FIG. 11, a second high temperature thermal oxidation is performed under dry atmosphere, forming a second oxide growth layer 150 on the device layer 116. In some embodiments, the second high temperature thermal oxidation is performed at a temperature in the range of about 800° C. to about 1200° C., and more preferably about 1100° C. In some particular embodiments, for example where the device layer 116 is comprised of undoped silicon, the second oxide growth layer 150 is comprised of silicon dioxide but other oxides are possible without departing from the spirit and scope of the present invention. The thickness of the second oxide growth layer 150 should preferably be equal or higher than the height of the non-buried part of the eventual anchors 152.

Figure 12:
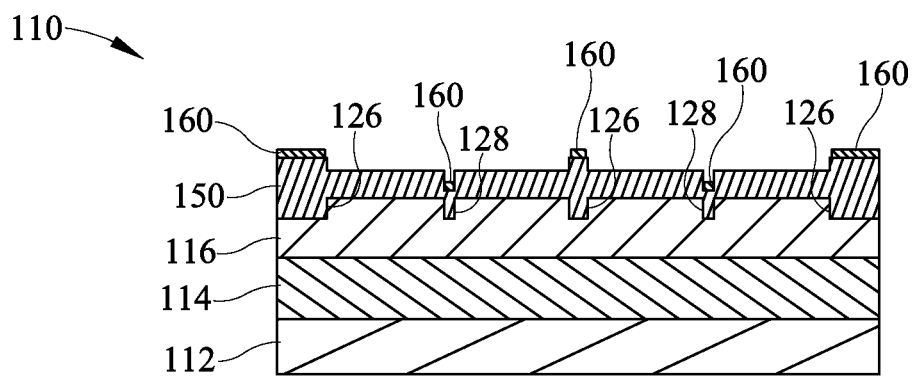
FIG. 12 is a schematic diagram of a third resist pattern formed on the SOI wafer of FIG. 11.

Referring now to FIG. 12, a third resist pattern 160 is deposited on an upper surface of the oxide growth layer 150 with openings everywhere except above where the posts 154 and anchors 152 will be formed. In other words, the third resist 160 is located only above the anchor holes 126 and the post holes 128. The lateral dimensions of the third resist pattern 160 define the lateral dimensions at the external surface of the second oxide growth layer 150 which forms the eventual anchors 152 and posts 154. In particular, it is contemplated that in some exemplary embodiments, the third resist pattern 160 is slightly narrower than each of the anchor holes 126 and post holes 128. The third resist pattern 160 represents a third photolithographic mask.

Figure 13:
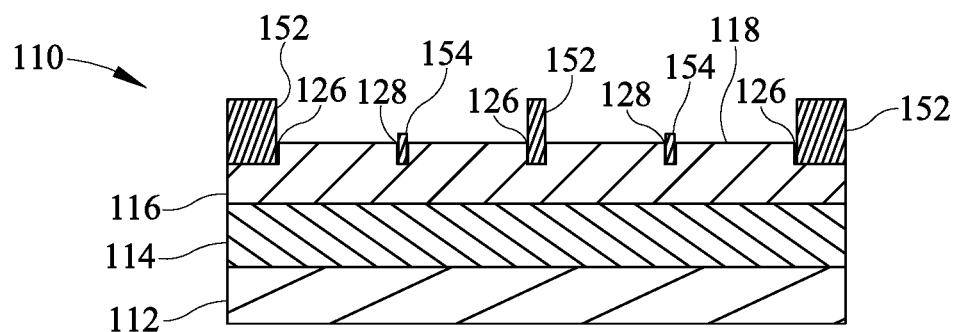
FIG. 13 is a schematic diagram of the SOI wafer of FIG. 12 after plasma etching is performed and the third resist is removed.

Referring now to FIG. 13, etching is performed to remove all the unmasked oxide. In some preferred embodiments, this is performed through plasma etching. Regardless, it is preferred that the etching removes the unmasked oxide growth layer 150 down to the device layer 116 therefore forming anchors 152 partially buried within the anchor holes 126 of the device layer 116 and posts 154 partially buried within post holes 128 of the device layer 116. As mentioned above, in some exemplary embodiments, the third resist 160 is slightly narrower than each of the post holes 128. As such, plasma etching results in a gap between the lateral walls of the post 154 and the lateral inner walls of the post holes 128. Likewise, in some exemplary embodiments, the third resist 160 is also slightly narrower than each of the anchor holes 126 such that there is a similar gap between the lateral walls of the anchors 152 and the lateral inner walls of the anchor holes 126. In embodiments where the lateral dimension of the third resist 160 is the same size as the anchor holes 126 and post holes 128, no such gaps are formed and the oxide growth layer 150 is etched down to the outer surface 118 of the device layer 116. Furthermore, it should be understood that selective etching allows for the oxide to be etched to a variable thickness which can, in some embodiment, result in the gap between the lateral walls of the post 154 and the lateral inner walls of the post holes 128 as well as the gap between the lateral walls of the anchors 152 and the lateral inner walls of the anchor holes 126 discussed above. In other embodiments where the etching is not selective, then other geometries may result due to the oxide being uniformly etched a predetermined distance. For example, non-selective etching can result in a gap around the posts but not around the anchors. In fact, depending on the relevant dimensions (e.g., the width of the holes defined in the device layer, the thickness of the oxide layer, and the width of the resist), a step may be formed on the anchor where a lower portion of the anchor is the width of the anchor hole while an upper portion of the anchor is a narrower width of the resist formed above the anchor hole.

Regardless, once the etching is completed, the resist 160 is lifted off leaving the device layer 116 with anchors 152 and posts 154 shown in FIG. 13.

Figure 14:
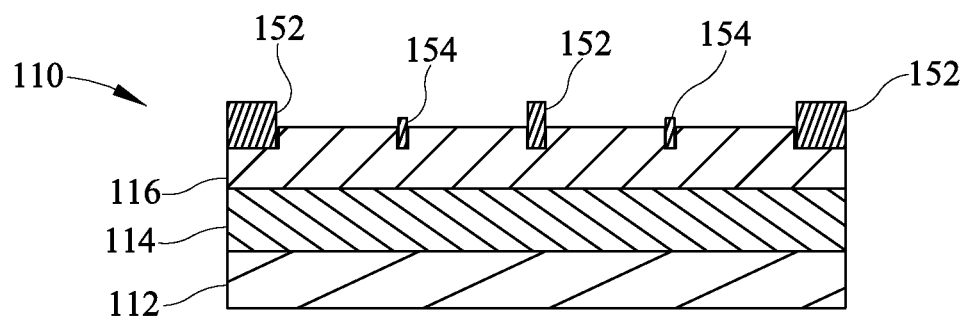
FIG. 14 is a schematic diagram of the SOI wafer of FIG. 13 after a second CMP is performed.

Referring now to FIG. 14, a second CMP is performed on the anchors 152. This planarizing step reduces the height of the anchors to define the vacuum cavity height of the CMUT 180 while also providing the best planarization and surface roughness of the anchors 152. Depending on the application, the height of the anchors 152 (and thus the cavity height) is reduced to a range of a few tens of nanometers to several hundreds of nanometers but in all instances the height of the anchors 152 is greater than the height of the posts 154.

Referring now to FIG. 15, the SOI 110 of FIG. 14, i.e., the handle 112, BOX layer 114, and device layer 116 with the partially buried anchors 152 and posts 154, is flipped and the anchors 152 are bonded (e.g., fusion bonded) on a bottom wafer of heavily doped silicon (i.e., a lower electrode 172). The handle 112 and the BOX layer 114 are removed and an upper electrode 174 is deposited on the device layer 116. This leads to the final CMUT 180 having a lower electrode 172, an upper electrode 174 and a membrane 116 (i.e., the device layer 116) with anchors 152 and isolation posts 154 formed on and partially buried within the membrane 116.

Of note, the thickness of the device layer 116, the duration and the two oxidations, the depth of the two (D)RIE, and the duration of the CMP can be modified to define the desired anchor height (i.e., the cavity height), the desired post height, and the desired lateral dimensions of both the anchors and the post which are buried inside the membrane.

Second Embodiment

Figure 16:
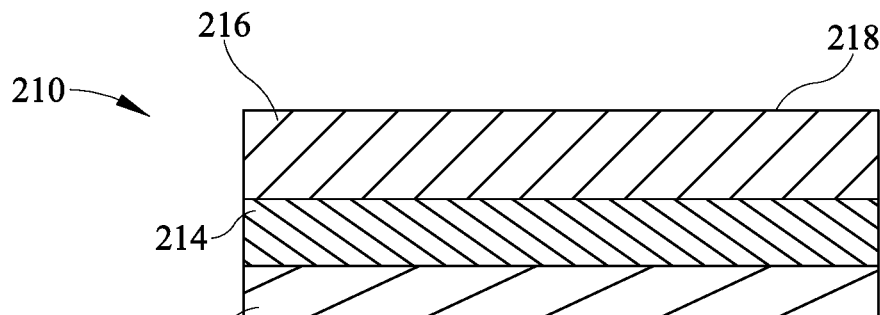
FIG. 16 is a schematic diagram of a SOI wafer used in accordance with a second implementation of the present invention.

According to a second exemplary method of producing a second embodiment of the CMUT of the present invention, and referring now to FIG. 16, the process starts from a classical SOI wafer 210 including, from bottom to top: handle 212; buried oxide (BOX) layer 214; and device layer 216 having an exposed outer surface 218. In some exemplary embodiments, the device layer 216 is an undoped silicon layer 216.

Figure 17:
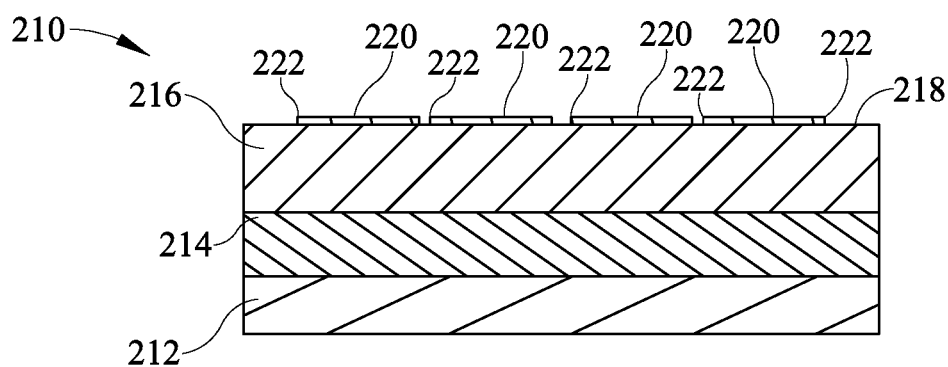
FIG. 17 is a schematic diagram of a first resist pattern formed on the SOI wafer of FIG. 16.

Referring now to FIG. 17, a first resist pattern 220 is deposited on the outer surface 218 of the device layer 216 with openings 222 defined through the resist 220 to expose the outer surface 218 of the device layer 216. As discussed below, the isolation posts 254 and the anchors 252 defining the CMUT 280 are formed at the locations of the openings 222 in the first resist pattern 220. In particular, the lateral dimensions of the posts 254 and anchors 252, which are discussed further below, are determined at this point. The first resist pattern 220 corresponds to a first photolithography mask.

Figure 18:
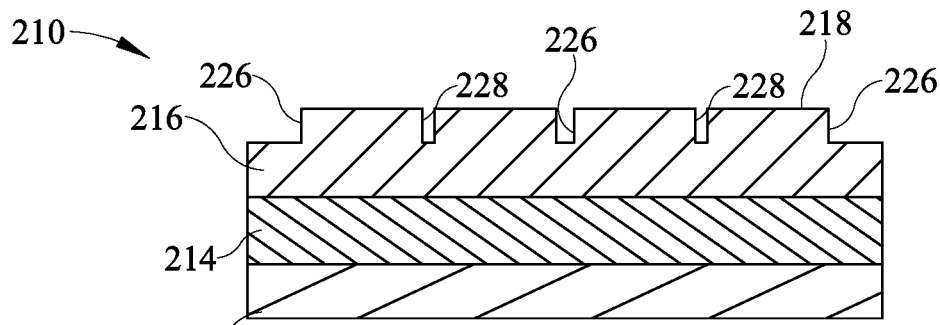
FIG. 18 is a schematic diagram of the SOI wafer of FIG. 17 after (D)RIE is performed and the first resist is removed.

Referring now to FIG. 18, a first (deep) reactive ion etching, i.e., (D)RIE, is made into the outer surface 218 of the device layer 216 forming anchor holes 226 and post holes 228 that extend partially into the device layer 216 at locations corresponding to the openings 222 in resist 220 shown in FIG. 17. Once the holes 226, 228 are formed, the resist 220 is lifted off leaving the device layer 216 with holes 226, 228 shown in FIG. 18.

According to some exemplary implementations, the width of the isolation posts 254 and the anchors 252 to be formed are defined at this step by the dimensions of the holes 226, 228 defined in the device layer 216. Likewise, the depth of the holes 226, 228 determines the depth of the part of the eventual posts 254 and anchors 252 which are buried within the device layer 216.

A deep etching of these holes 226, 228 within the device layer 216 increases the isolation of the resulting posts/anchors but also reduces the mechanical strength of the resulting membrane. Therefore, the depth of the holes 226, 228 is typically kept to less than about 80% of the thickness of the device layer 116. The lateral dimensions of the holes 226, 228 are calculated by adding the lateral dimension of the non-buried part of the eventual restive anchors or posts to n times the hole depth, where n is a factor typically around 2.0.

Figure 19:
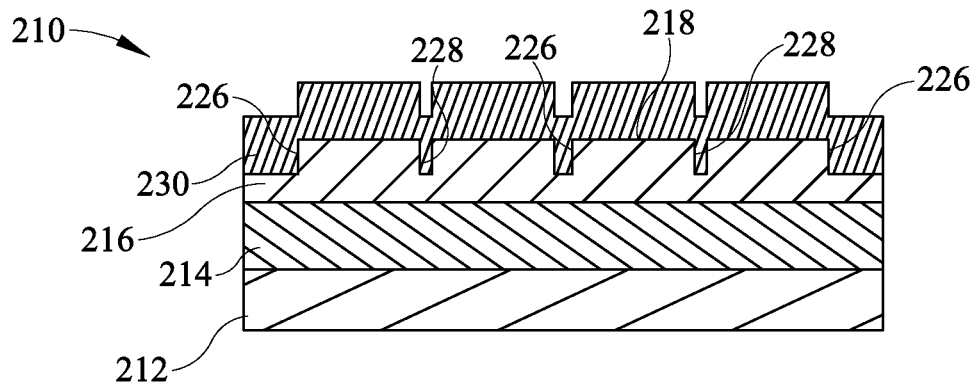
FIG. 19 is a schematic diagram of a first oxide growth formed on the SOI wafer of FIG. 18.

Referring now to FIG. 19, a first oxide growth layer 230 is formed on the device layer 216 so as to fill each of the holes 226, 228 as well as cover the outer surface 218 of the device layer 216. In particular, in some preferred embodiments, a high temperature dry oxidation is performed under dry atmosphere on the whole SOI wafer (i.e., handle 212, BOX layer 214, and device layer 216) forming the first oxide growth layer 230. The thickness of the first oxide growth layer 230 is equal or higher than the height of the non-buried part of the eventual anchors 252. In some embodiments, the high temperature thermal oxidation is performed at a temperature in the range of about 800° C. to about 1200° C., and more preferably about 1100° C.

Figure 20:
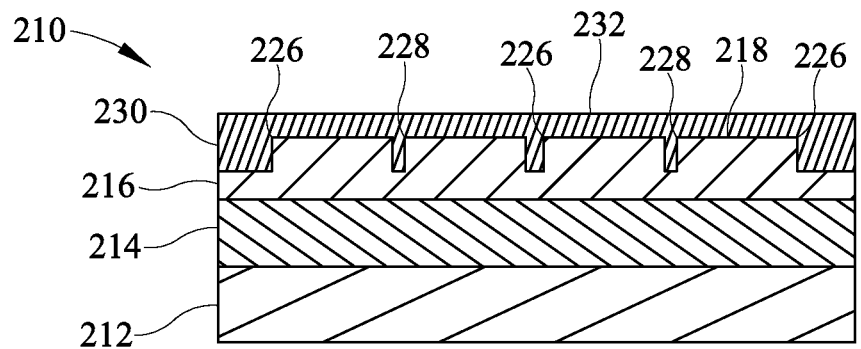
FIG. 20 is a schematic diagram of the SOI wafer of FIG. 19 after a first CMP is performed.

Referring now to FIG. 20, a chemical-mechanical planarization (CMP) is performed to level the first oxide growth layer 230. The distance between the upper surface 218 of the device layer 216 and the upper surface 232 of the planarized first oxide growth layer 230 defines the height of the eventual anchors 252. Depending on the application, the anchor height typically ranges from few tens of nanometers to several hundreds of nanometers.

Figure 21:
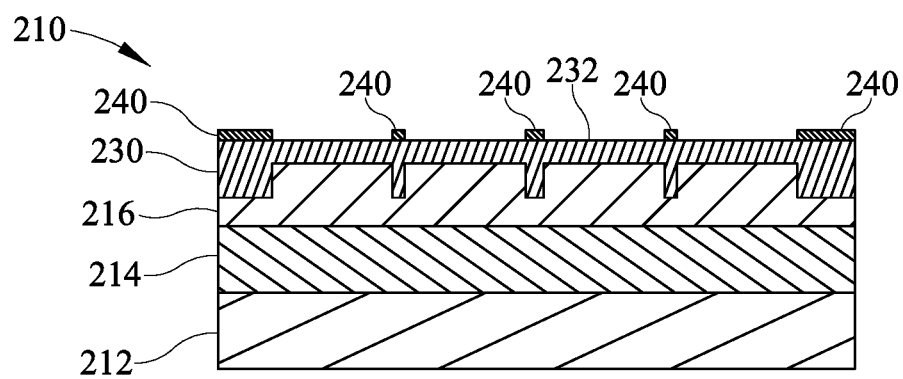
FIG. 21 is a schematic diagram of a second resist pattern formed on the SOI wafer of FIG. 20.

Referring now to FIG. 21, a second resist pattern 240 is deposited on the now planar upper surface 232 of the first oxide growth layer 230. The second resist pattern 240 is located only where the isolation posts 254 and the anchors 252 are going to be formed. The resist pattern 240 therefore corresponds to the lateral dimensions of the eventual posts 254 and anchors 252. The second resist pattern 240 represents a second lithography mask.

Figure 22:
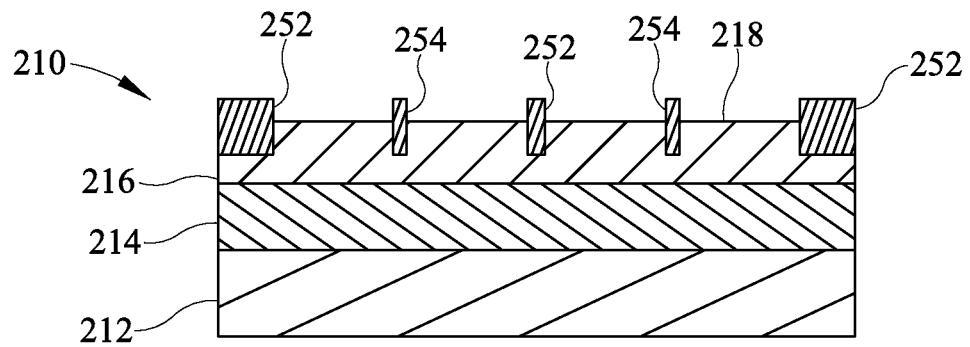
FIG. 22 is a schematic diagram of the SOI wafer of FIG. 21 after plasma etching is performed and the second resist is removed.

Referring now to FIG. 22, plasma etching is performed to remove the first oxide growth layer 230 which is not covered by the second resist pattern 240 down to the outer surface 218 of the device layer 216. After the etching step, the second resist pattern 240 is then lifted-off leaving the resulting anchors 252 and the resulting insulation posts 254 with the cavities between the anchors 252.

Figure 23:
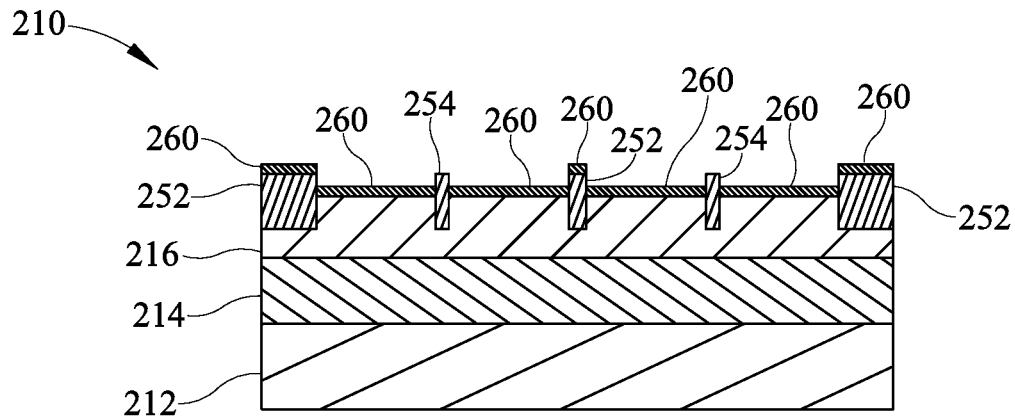
FIG. 23 is a schematic diagram of a third resist pattern formed on the SOI wafer of FIG. 22.

Referring now to FIG. 23, a third resist pattern 260 is deposited with openings only where the isolation posts 254 are going to be partially etched. That is to say the third resist pattern 260 covers the exposed outer surface 218 of the device layer 216 as well as the anchors 252, but it does not cover the posts 254. The third resist pattern 260 corresponds to a third photolithographic mask.

Figure 24:
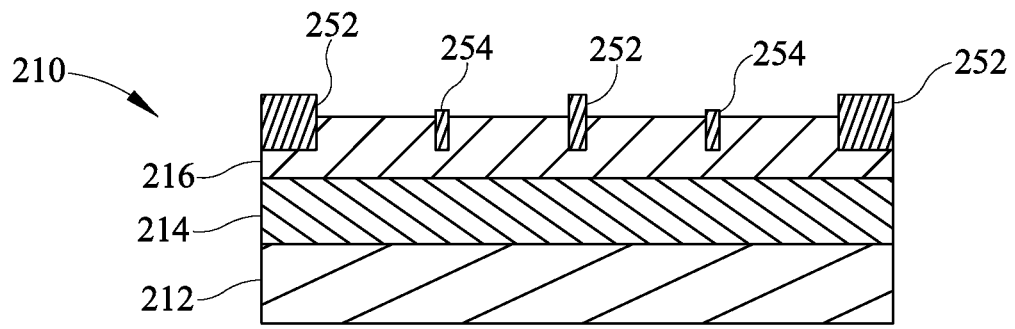
FIG. 24 is a schematic diagram of the SOI wafer of FIG. 23 after additional plasma etching is performed and the third resist is removed.

Referring now to FIG. 24, a second plasma etching (i.e., a partial etching) is performed to reduce the height of the posts 254. After this etching step, the third resist 260 is lifted-off, leaving the final anchors 252 and posts 254 with a height difference between the external (or contact) surface of the posts 254 and the external surface of the anchors 252 defining the gap of the CMUT device 280 (i.e. the maximum displacement of the membrane 216).

Referring now to FIG. 25, the SOI 210, i.e., the handle 212, BOX layer 214, and device layer 216 with the partially buried anchors 252 and posts 254, is flipped and the anchors 252 are bonded (e.g., fusion bonded) on a bottom wafer of heavily doped silicon (i.e., a lower electrode 272), the handle 212 and the BOX layer 214 are removed and a top electrode 274 is deposited. This leads to the final CMUT 280 having a lower electrode 272, an upper electrode 274, and a membrane 216 (i.e., the device layer 216) with anchors 252 and isolation posts 254 formed on and partially buried within the membrane 216.

As compared to the first method of the present invention described above with reference to FIG. 4-15, the second exemplary method of the present invention requires less steps and is simpler. The resulting CMUT 280 keeps all the advantages of the CMUT 180 manufactured according to the first embodiment, except that the contact surface of the isolation posts 254 has been partially etched, which may degrade the contact surface of the post 254 and inject charges.

Third Embodiment

A third exemplary method of producing a third embodiment of the CMUT of the present invention is a simplified variant which includes fewer intermediate steps. The third methods uses only two photolithography masks. In addition, it has the advantage of resulting in a better quality layer of oxide, as the oxide layer is obtained with only one oxidation step. Furthermore, the third embodiment avoids any partial etching steps.

Figure 26:
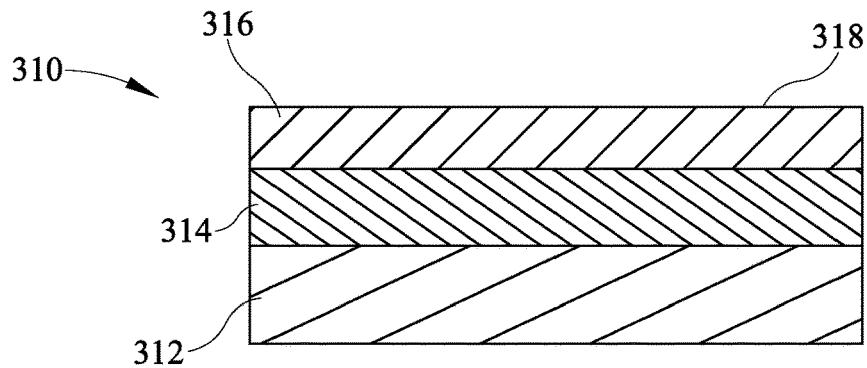
FIG. 26 is a schematic diagram of a SOI wafer used in accordance with a third implementation of the present invention.

Referring now to FIG. 26, the third method starts from a classical SOI wafer 310 including, from bottom to top: handle 312; buried oxide (BOX) layer 314; and device layer 316 having an exposed outer surface 318. In some exemplary embodiments, the device layer 316 is an undoped silicon layer 316.

Figure 27:
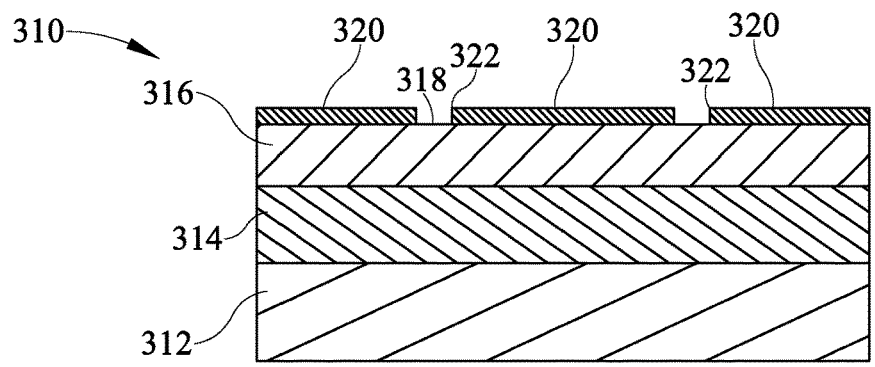
FIG. 27 is a schematic diagram of a first resist pattern formed on the SOI wafer of FIG. 26.
Figure 28:
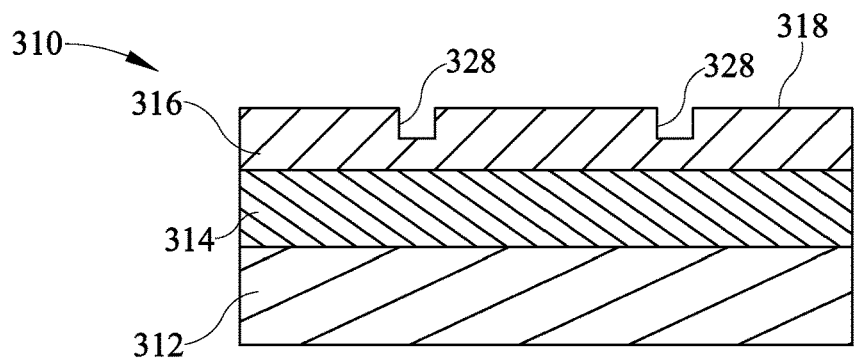
FIG. 28 is a schematic diagram of the SOI wafer of FIG. 27 after (D)RIE is performed and the first resist is removed.

Referring now to FIG. 27, a first resist pattern 320 is deposited on the outer surface 318 of the device layer 316 with openings 322 defined through the resist 320 to expose the outer surface 318 of the device layer 316. As discussed below, the isolation posts 354 are formed at the locations of the openings 322 in the first resist pattern 320. Unlike in the first two embodiments, no openings in the first resist pattern 320 correspond to the location of the anchors 352. The first resist pattern 320 corresponds to a first photolithography mask Referring now to FIG. 28, a partial dry etching (i.e., reactive ion etching) is performed on the outer surface 318 of the device layer 316, creating wells 328. The depth of the wells 328 directly results in the final gap height (i.e., the maximum vertical displacement of the membrane 316 before it contacts the bottom electrode 372). The lateral dimension of the wells 328 corresponds to the lateral dimensions of the eventual cavity within which the post 354 will be buried. Once the wells 328 are formed, the resist 320 is lifted off, leaving the device layer 316 with wells 328 shown in FIG. 28.

Figure 29:
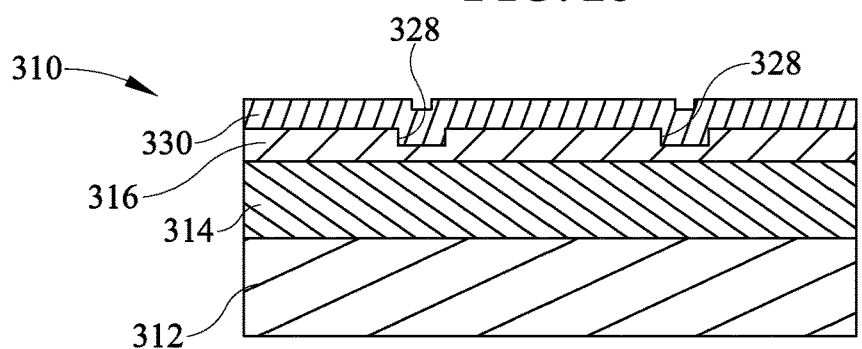
FIG. 29 is a schematic diagram of an oxide growth formed on the SOI wafer of FIG. 28.

Referring now to FIG. 29, an oxide growth layer 330 is formed on the device layer 316 so as to fill each of the well 328 as well as cover the outer surface 318 of the device layer 316. In particular, in some preferred embodiments, a high temperature dry oxidation is performed under dry atmosphere on the whole SOI wafer (i.e., handle 312, BOX layer 314, and device layer 316) forming the oxide growth layer 330. In some embodiments, the high temperature thermal oxidation is performed at a temperature in the range of about 800° C.-1200° C., and more preferably about 1100° C. The thickness of the oxide growth layer 330 corresponds to the height of the eventual anchors 352.

Figure 30:
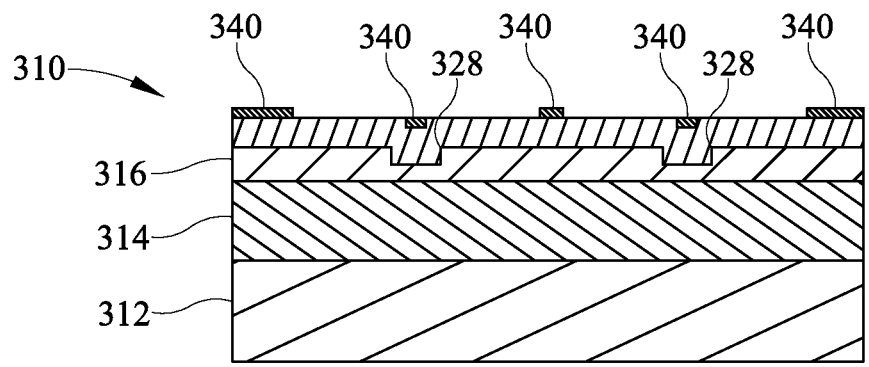
FIG. 30 is a schematic diagram of a second resist pattern formed on the SOI wafer of FIG. 29.

Referring now to FIG. 30, a second resist pattern 340 is applied on the oxide growth layer 330. The second resist pattern 340 is located only where the isolation posts 354 and the anchors 352 are going to be formed. The resist pattern 340 therefore corresponds to the lateral dimensions of the eventual posts 354 and anchors 352. The second resist pattern 340 represents a second lithography mask.

Figure 31:
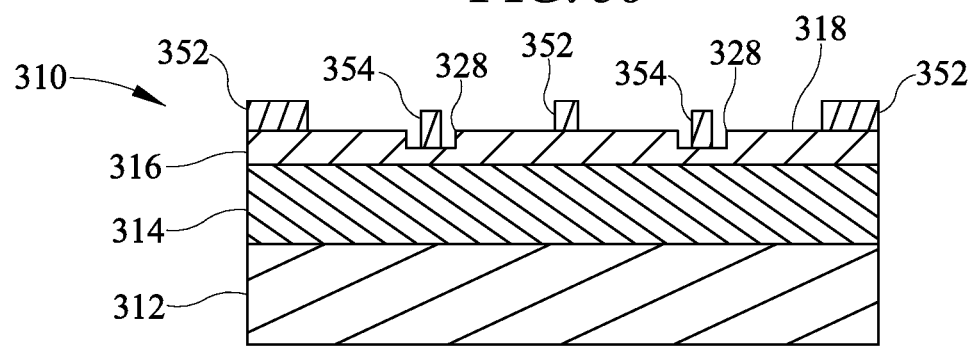
FIG. 31 is a schematic diagram of the SOI wafer of FIG. 30 after plasma etching is performed and the second resist is removed.

Referring now to FIG. 31, the oxide growth 330 is then patterned with a highly anisotropic plasma etch to remove the oxide growth layer 330 which is not covered by the second resist pattern 340 down to the device layer 216. After the etching step, the second resist pattern 340 is then lifted-off leaving the resulting anchors 352 and the resulting insulation posts 354 partially buried within the well 328 between the anchors 352.

Referring now to FIG. 32, the SOI 310, i.e., the handle 312, BOX layer 314, and device layer 316 with the anchors 352 and partially buried posts 354, is flipped and the anchors 352 are bonded (e.g., fusion bonded) on a bottom wafer of heavily doped silicon (i.e., a lower electrode 372), the handle 312 and the BOX layer 314 are removed and a top electrode 374 is deposited. This leads to the final CMUT 380 having a lower electrode 372, an upper electrode 374, and a membrane 316 (i.e., the device layer 316) with anchors 352 and isolation posts 354 formed on and partially buried within the membrane 316.

As a result of the simplified process, the height on insulation posts 354 is the same as the height of anchors 352. As such, the parasitic capacitance is not reduced in the anchors 352.

Comparison of Embodiments

As reflected in Table 1 below, the first exemplary method requires four photolithographic masks; results in no partial etching of the silicon dioxide (e.g., the resulting anchors 152 and isolation posts 154); provides reduced parasitic capacitance at the anchors 152; and involves growing silicon dioxide (e.g., the oxide growths 130, 150) on an undoped silicon layer (e.g., the device layer 116). Furthermore, the second exemplary method requires three photolithographic masks; results in partial etching of the silicon dioxide (e.g., the resulting anchors 252 and isolation posts 254); provides reduced parasitic capacitance at the anchors 252; and involves growing silicon dioxide (e.g., the oxide growths 230) on an undoped silicon layer (e.g., the device layer 216). The third exemplary method requires two photolithographic masks; results in no partial etching of the silicon dioxide (e.g., the resulting anchors 352 and isolation posts 354); does not provide reduced parasitic capacitance at the anchors 250; and involves growing silicon dioxide (e.g., the oxide growths 330) on an undoped silicon layer (e.g., the device layer 316).

TABLE 1

| Embodiment | 1 | 2 | 3 |
|---|---|---|---|
| Number of masks | 4 | 3 | 2 |
| Avoids partial etching of SiO2 | Yes | No | Yes |
| Reduce parasitic Cap (anchors) | Yes | Yes | No |
| SiO$_2$ grown on undoped Si | Yes | Yes | Yes |

Partially Buried Posts

Most of the features which are expected to improve the performances and reduce the charge trapping in the CMUT device of the present invention are due, at least in part, to the partially buried posts and protective guard rings used to avoid electric breakdown from the sides of the posts.

Referring now to FIG. 33A and FIG. 33B which illustrate an isolation post 454 exemplary of one or more of the posts 154, 254, 354 described above, as shown, the post 454 is partially buried within a membrane 416 so as to be spaced apart from an upper electrode 474. The post 454 includes a central member 456 surrounded by a guard ring 458.

The central member 456 of the post 454 of the present invention is constructed to be partially buried inside the membrane 416 as described above and surrounded by a guard ring 458 for increased protection. This particular topology is a novel invention. This new post 454 (i.e., the central member 456 and guard ring 458) has an overall mushroom-like shape. During thermal oxidation of a silicon layer (e.g., the formation of the oxide growth layers 130, 230, 330 on the device layers 116, 216, 316 described above) it has been found that the horizontal and vertical surfaces of the silicon layer are transformed into a smooth oxide when the process is performed in dry oxygen. This is mostly due to a non-uniform growth at the convex and concave corners of cavity formed into the silicon layer.

As shown in FIG. 33B, this exemplary post 454 is substantially round, but posts of the present invention can also have a rectangular shape or any other geometrical shape while still including the same overall mushroom-like shape illustrated in FIG. 33A. This structure can be used to create not only isolation posts 454, but also anchors (e.g., anchors 152, 252, 352) defining the CMUT cells and the edges of the cavity.

Referring now to FIGS. 34A, 34B, 34C, in some embodiments (FIG. 34A) the guard ring 458a is made of the same material than the central member 456 of the post 454. However, depending on the main role of the post 454 and the targeted applications, the guard ring 458c can be made of another material (FIG. 34C), or even an empty channel 458b around the post 454 (FIG. 34B). The use of the term "empty" here means that the guard ring is, for example, the same composition as the vacuum/air gap).

The variation shown in FIG. 34A can be obtained, for example, with the second embodiment method. Whereas the variation shown in FIG. 34B can be obtained, for example, with the first or third embodiment methods. Finally the variation in FIG. 34C requires only a very little change to the manufacturing process. Starting from the FIG. 34B configuration, a second material is deposited (e.g. sputtering) on the whole external surface of the membrane 416 and the posts 454 in order to completely fill the empty guard ring 458b. Then this second material is removed with a partial selective etching step except in the region of the guard ring, leaving the guard ring 458c made of the second material.

Some exemplary materials for use as guard rings are in the category of solid-state insulating material such as silicon nitride, metal oxides (e.g. aluminum oxide, zirconium oxide, hafnium oxide) or any other dielectric material in use in the semiconductor industry, provided these material can be applied by a deposition process and can be partially removed by a selective etching process, i.e. the etching step does not remove the material of the central member 456 or the membrane 416 as discussed above.

Figure 1A:
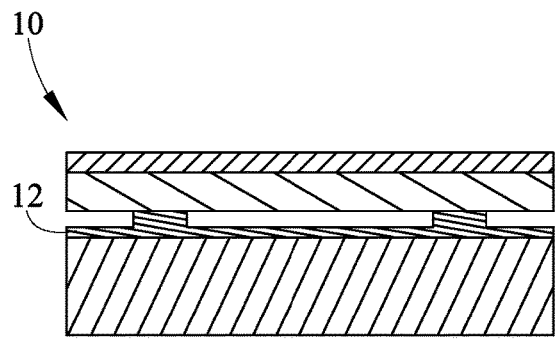
FIG. 1A is a schematic diagram of a classical CMUT design known in the art with a plain insulation layer.

With the classical CMUT design (e.g., the CMUT 10 shown in FIG. 1A), the device capacitance is given by equation 1:

$$C = \int_S \varepsilon_0 \frac{1}{h_{gap} + \frac{h_{iso}}{\varepsilon_{iso}}} dS \qquad \text{Equation 1}$$

With $h_{gap}$ being the height of the cavity (i.e., the distance between the membrane and the insulation layer 12; $h_{iso}$ being the height of insulation layer 12; S being the total surface of the membranes; $\varepsilon_0$ being the vacuum permittivity; and $\varepsilon_{iso}$ being the dielectric constant of the insulation layer.

Figure 1B:
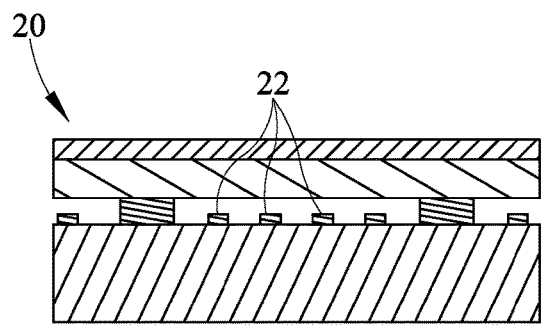
FIG. 1B is a schematic diagram of a modified CMUT design known in the art with isolation posts.
Figure 2A:
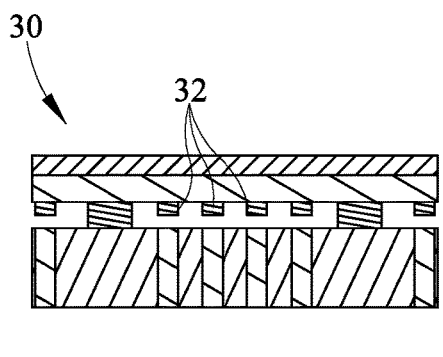
FIG. 2A is a schematic diagram of another CMUT design known in the art with isolation posts hanging below the membrane.
Figure 2B:
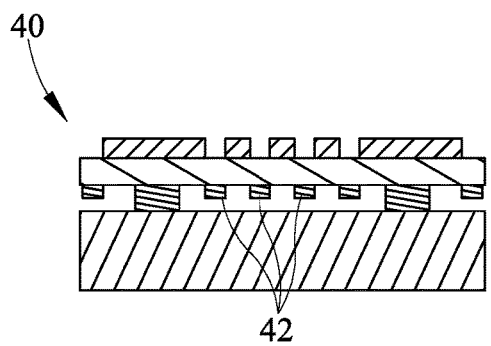
FIG. 2B is a schematic diagram of another CMUT design known in the art with a pattered top electrode.
Figure 3:
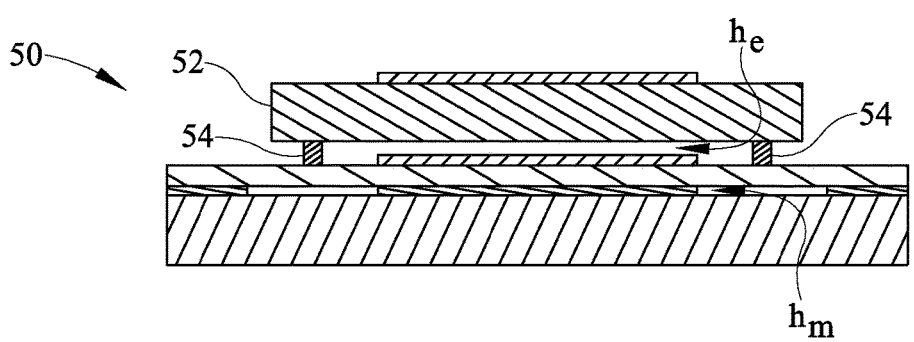
FIG. 3 is a schematic diagram of another CMUT design known in the art.

For a CMUT cell designed with classical isolation posts (e.g., the CMUT 20 shown in FIG. 1B), the capacitance is given by equation 2:

$$C = \int_{S_1} \varepsilon_0 \frac{1}{h_{gap} + h_{iso}} dS + \int_{S_2} \varepsilon_0 \frac{1}{h_{gap} + \frac{h_{iso}}{\varepsilon_{iso}}} dS \quad \text{Equation 2}$$

Where $S_2$ is the total surface of the posts 22, and $S_1$ is equal to S minus $S_2$. As $S_1 \gg S_2 (S_1 \approx S)$, the second term can reasonably be neglected. Therefore, for a given acoustic design (same S and $h_{gap}$) we can easily see that the use of classical isolation posts reduces the capacitance of the device, as $h_{gap} + h_{iso} > h_{gap} + h_{iso}/\varepsilon_{iso}$. Furthermore, the thickness of the IL $h_{iso}$ cannot be further reduced, as it needs to be tall enough to avoid the dielectric breakdown of the post.

With the partially buried isolation post of the present invention, and referring once again to FIG. 33A, the height of the post 454 protruding from the membrane ($h_{exceed}$) can be reduced while maintaining a total height ($h_{iso}$) of the post 454 that is tall enough to avoid the dielectric breakdown. This is accomplished by increasing the height of the post 454 which is buried within the membrane 416 ($h_{buried}$). With such a design, the capacitance can be preserved, or even increased if $h_{exceed} < h_{gap} + h_{iso}/\varepsilon_{iso}$.

Furthermore, $h_{buried}$ can be increased at will while keeping $h_{exceed}$ at a low value. This means that the total height $h_{iso}$ can be greater than the one used in classical designs (e.g., FIGS. 1A and 1B), and therefore the electric field across the isolation posts can be greatly reduced. It is well-known that the charge trapping is directly related to the electric field across the dielectric material. Therefore, the new design should lead to a decrease of the charging phenomenon as it allows the use of tall isolation posts without decreasing the overall performances.

Finally, while burying the isolation posts inside the membrane, one should keep in mind that dielectric breakdown could happen from the side of the isolation posts, at the interface between the isolation posts and the membrane. This limits the decrease of $h_{exceed}$. To overcome this issue, the present invention proposes to use a guard ring. With use of a guard ring, dielectric breakdown is avoided if the minimum distance between the electric potential of the top and the bottom electrodes is big enough. In other words, and referring once again to FIG. 33A, in the worst case in which the isolation post is touching the bottom of the cavity (i.e. the bottom electrode), the distance between each point on the end surface of the central member 456 of the post 454 (i.e., the contact surface of the post 454) to each point of on the buried surface of the guard ring 458 of the post 454 should be big enough to avoid dielectric breakdown (see FIG. 33B). This can be ensured by the use of the guard ring 458. Moreover, because of the natural round shape of the buried surface of the guard ring 458, this design greatly reduces the risk of lightning rod effects.

In some configurations, the design of the partially buried post 360 described above can be used with the anchors (e.g., anchors 152, 252, 352) defining the CMUT cells, and possibly having a vacuum guard ring. In this case, the membrane in the vicinity of the anchors of the cells are significantly thinner than the center of the membrane. This can be used to produce piston-like displacement of the membranes as the rigidity of the membrane will be reduced adjacent to the anchors. This will increase the transmit sensitivity of the device.

Figure 35:
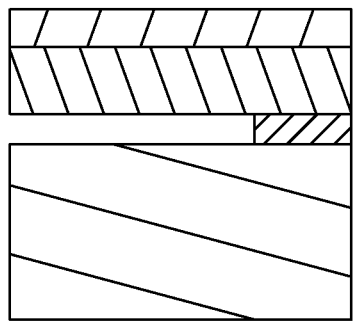
FIG. 35 illustrate different possible configurations of partially buried anchors used to produce piston-like displacements of the membranes.
Figure 35:
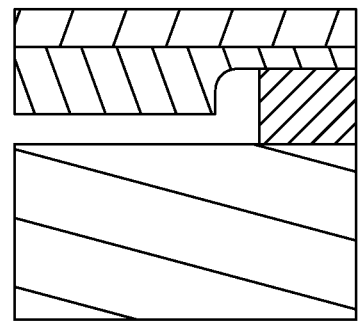
Figure 35:
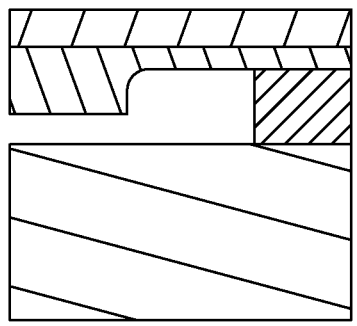
Figure 35:
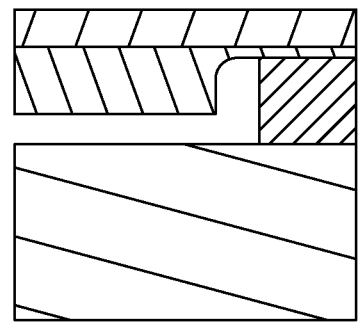
Figure 35:
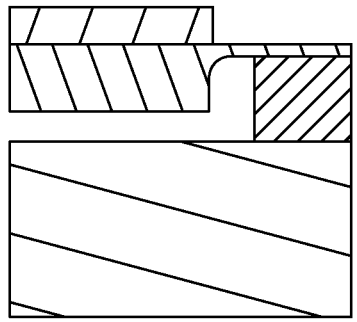

In particular, and referring now to FIG. 35, which illustrate different possible configurations of partially buried anchors used to produce piston-like displacements of the membranes. Each of the configurations shown in FIG. 35 only shows the right side of a cell, but the same designs are equally applicable on the left side of the cell.

Configuration I illustrates a classical anchor in which the membrane has a uniform thickness.

Configuration II illustrates one anchor of the present invention with a vacuum guard ring.

Configuration III illustrates another anchor of the present invention similar to Configuration II but with the vacuum guard ring having a larger width.

Configuration IV illustrates another anchor of the present invention similar to Configuration II but with remaining silicon membrane above the anchor having a smaller thickness.

Configuration V illustrates another anchor of the present invention similar to Configuration IV but with the top electrode patterned to improve piston-like displacement.

Although the above description of partially buried isolation posts and anchors is provided with respect to Capacitive Micromachined Ultrasonic Transducers, it is contemplated that similar designs and concepts are applicable to other capacitive MEMS.

One of ordinary skill in the art will recognize that additional embodiments are possible without departing from the teachings of the present invention. This detailed description, and particularly the specific details of the exemplary embodiment disclosed therein, is given primarily for clarity of understanding, and no unnecessary limitations are to be understood therefrom, for modifications will become obvious to those skilled in the art upon reading this disclosure and may be made without departing from the spirit or scope of the invention.

REFERENCES

[1] Y. Huang, E. O. Haeggström, X. Zhuang, A. S. Ergun, and B. T. Khuri-Yakub, "A solution to the charging problems in capacitive micromachined ultrasonic transducers," *IEEE Trans. Ultrason. Ferroelectr. Freq. Control*, vol. 52, no. 4, pp. 578-80, April 2005.

[2] Y. Huang, X. Zhuang, E. O. Haeggstrom, a. S. Ergun, C. H. Cheng, and B. T. Khuri-Yakub, "Capacitive micromachined ultrasonic transducers (CMUTs) with isolation posts," *Ultrasonics*, vol. 48, no. 1, pp. 74-81, 2008.

[3] Y. Huang and B. T. Khuri-yakub, "Capacitive Ultrasonic Transducers with isolation posts," 2009.

[4] S. Machida, H. Enomoto, Y. Tadaki, and T. Nagata, "Ultrasonic Transducer and manufacturing method thereof," Publication n° U.S. Pat. No. 8,198,782, 2012.

[5] S. Machida, T. Takezaki, T. Kobayashi, H. Tanaka, and T. Nagata, "Highly Reliable CMUT Cell Structure with Reduced Dielectric Charging Effect," in *IEEE International Ultrasonics Symposium, IUS*, 2015, pp. 1-4.

[6] B. Greenlay and R. Zemp, "CMUT Isolated Isolation Posts," in 2017 *IEEE International Ultrasonics Symposium*.

[7] M. M. Mahmud et al., "Improved CMUT structure and method of operation for dual-frequency acoustic angiography," in 2017 *IEEE International Ultrasonics Symposium*, no. 1160483, pp. 2-5.

[8] J. Klootwijk, P. Dirksen, M. Mulder, and E. Moonen, "Capacitive Micromachined Ultrasound Transducer.", US20150162851A1, 2015

[9] A. S. Savoia, B. Mauti, G. Caliano, L. Maiolo, A. Minotti, and A. Pecora, "Optimization of the Efficiency and Reliability of Reverse-Fabricated CMUT Arrays," in 2017 *IEEE International Ultrasonics Symposium*.

What is claimed is:

1. A method of producing a capacitive micromachined ultrasonic transducer, the method comprising the steps of:
   providing a device layer of undoped silicon with an outer surface that is exposed;
   etching the outer surface of the device layer to form post holes extending partially into the device layer;
   forming a first oxide growth layer on the device layer so as to fill the post holes and cover the outer surface of the device layer;
   forming a second oxide growth layer;
   removing portions of the first oxide growth layer and the second oxide growth layer to form anchors extending beyond the outer surface of the device layer and posts partially buried within the post holes and extending beyond the outer surface of the device layer;
   bonding the anchors to a first electrode forming a cavity defined by the first electrode, the device layer, and the anchors, the posts positioned within the cavity; and
   depositing an upper electrode on a surface of the device layer opposite from the outer surface of the device layer;
   wherein the device layer is a membrane of the capacitive micromachined ultrasonic transducer with the posts positioned within the cavity and partially buried within the membrane and extending towards the first electrode.

2. The method of claim 1, wherein the outer surface of the device layer is etched to form anchor holes extending partially through the device layer and the anchors are partially buried within the anchor holes.

3. The method of claim 1, wherein the step of forming the first oxide growth layer on the device layer is performed by high temperature thermal oxidation of the device layer.

4. The method of claim 3, wherein the high temperature thermal oxidation is done at a temperature of 800° C. to 1200° C.

5. The method of claim 1, wherein the first oxide growth layer is formed to a thickness greater than or equal to a depth of the post holes.

6. The method of claim 1, wherein the first oxide growth layer is formed to a thickness greater than or equal to a height of the anchors.

7. The method of claim 1, and further comprising a step of planarizing the first oxide growth layer.

8. The method of claim 7, wherein the first oxide growth layer is planarized until even with the outer surface of the device layer.

9. The method of claim 8, and further comprising a step of chemically etching the first oxide growth layer out of the post holes.

10. The method of claim 9, wherein in the step of forming the second oxide growth layer, the second oxide growth layer is formed on the device layer so as to fill the post holes and cover the outer surface of the device layer;
   wherein portions of the second oxide growth layer are removed to form the anchors and the posts.

11. The method of claim 9, and further comprising a step of planarizing the anchors.

12. The method of claim 7, wherein the first oxide growth layer is planarized until the first oxide growth layer has a thickness equal to a height of the anchors.

13. The method of claim 1, wherein the step of removing portions of the first oxide growth layer and the second oxide growth layer includes plasma etching the second oxide growth layer to form the anchors and posts.

14. The method of claim 1, and further comprising a step of plasma etching the posts to reduce a height of the posts to be less than a height of the anchors.

* * * * *